(12) United States Patent
Shuey

(10) Patent No.: US 7,227,350 B2
(45) Date of Patent: Jun. 5, 2007

(54) BIAS TECHNIQUE FOR ELECTRIC UTILITY METER

(75) Inventor: Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 23 days.

(21) Appl. No.: 10/803,213

(22) Filed: Mar. 18, 2004

(65) Prior Publication Data

US 2005/0206366 A1   Sep. 22, 2005

(51) Int. Cl.
*G01R 11/32* (2006.01)
(52) U.S. Cl. .................................. 324/158.1; 324/142
(58) Field of Classification Search ................ 324/142, 324/74, 771, 158.1
See application file for complete search history.

(56) References Cited

U.S. PATENT DOCUMENTS

| | | | |
|---|---|---|---|
| 3,445,815 A | 5/1969 | Saltzberg et al. ............. 30/163 |
| 3,858,212 A | 12/1974 | Tompkins et al. .... 343/100 CS |
| 3,878,512 A | 4/1975 | Kobayashi et al. ..... 340/168 R |
| 3,973,240 A | 8/1976 | Fong .......................... 340/151 |
| 3,976,941 A | 8/1976 | Milkovic ..................... 324/142 |
| 4,015,146 A * | 3/1977 | Aihara et al. ................ 327/568 |
| 4,031,513 A | 6/1977 | Simciak .................... 340/152 T |
| 4,056,107 A | 11/1977 | Todd et al. ................ 130/27 R |
| 4,132,981 A | 1/1979 | White ......................... 340/203 |
| 4,156,273 A | 5/1979 | Sato ......................... 363/21.16 |
| 4,190,800 A | 2/1980 | Kelly, Jr. et al. ............. 325/37 |
| 4,204,195 A | 5/1980 | Bogacki ..................... 340/151 |
| 4,206,367 A * | 6/1980 | Petruska et al. ................ 307/2 |
| 4,209,826 A | 6/1980 | Priegnitz ................. 363/21.07 |
| 4,218,737 A | 8/1980 | Buscher et al. ............. 364/493 |
| 4,250,489 A | 2/1981 | Dudash et al. ........... 340/147 T |
| 4,254,472 A | 3/1981 | Juengel et al. .............. 364/900 |
| 4,315,251 A * | 2/1982 | Robinson et al. ....... 340/870.02 |
| 4,319,358 A | 3/1982 | Sepp ............................. 375/1 |
| 4,321,582 A | 3/1982 | Banghart ................ 340/310 R |
| 4,361,890 A | 11/1982 | Green, Jr. et al. .............. 375/1 |

(Continued)

FOREIGN PATENT DOCUMENTS

AU         87/68113         8/1987

(Continued)

OTHER PUBLICATIONS

"MOSFET Diode-OR Controller" by Linear Technology, 2003.*

(Continued)

*Primary Examiner*—Paresh Patel
(74) *Attorney, Agent, or Firm*—Woodcock Washburn LLP

(57) ABSTRACT

The invention contemplates an electrical power meter and method of operating the same, where the meter has electronic components (e.g., a power supply and a voltage sensing circuit) and receives alternating current (AC) voltage from an electrical power line. The inventive meter includes a power supply that converting the AC voltage to a direct current (DC) voltage for powering the electronic components. Also, the AC voltage provides an electrical reference potential for the electronic components. The inventive meter further includes a DC power source (e.g., a diode and/or a resistor in series connection) in a parallel circuit configuration with the AC voltage. The DC power source provides a DC bias voltage to the AC voltage. The AC voltage may create a relatively small voltage across the diode device.

19 Claims, 5 Drawing Sheets

U.S. PATENT DOCUMENTS

| | | | |
|---|---|---|---|
| 4,389,702 A | 6/1983 | Clemente et al. | 363/56 |
| 4,405,829 A | 9/1983 | Rivest et al. | 178/22.14 |
| 4,415,896 A | 11/1983 | Allgood | 340/870.03 |
| 4,438,485 A | 3/1984 | Voigt | 363/21.1 |
| 4,466,001 A | 8/1984 | Moore et al. | 340/825.08 |
| 4,497,017 A | 1/1985 | Davis | 363/49 |
| 4,504,831 A | 3/1985 | Jahr et al. | 340/870.03 |
| 4,506,386 A | 3/1985 | Ichikawa et al. | 455/343 |
| 4,525,861 A | 6/1985 | Freeburg | 455/33 |
| 4,566,060 A | 1/1986 | Hoeksma | 363/131 |
| 4,600,923 A | 7/1986 | Hicks et al. | 340/870.02 |
| 4,607,320 A | 8/1986 | Matui et al. | 363/21.17 |
| 4,608,699 A | 8/1986 | Batlivala et al. | 375/216 |
| 4,611,333 A | 9/1986 | McCallister et al. | 375/1 |
| 4,614,945 A | 9/1986 | Brunius et al. | 340/870.02 |
| 4,617,566 A | 10/1986 | Diamond | 340/870.11 |
| 4,622,627 A | 11/1986 | Rodriguez et al. | 363/37 |
| 4,623,960 A | 11/1986 | Eng | 363/21.08 |
| 4,628,313 A | 12/1986 | Gombrich et al. | 340/870.02 |
| 4,631,538 A | 12/1986 | Carreno | 340/870.18 |
| 4,638,245 A * | 1/1987 | MacPhee et al. | 324/519 |
| 4,638,298 A | 1/1987 | Spiro | 340/827 |
| 4,644,321 A | 2/1987 | Kennon | 340/310 A |
| 4,653,076 A | 3/1987 | Jerrim et al. | 375/115 |
| 4,680,704 A | 7/1987 | Konicek et al. | 364/525 |
| 4,688,038 A | 8/1987 | Giammarese | 340/870.02 |
| 4,692,761 A | 9/1987 | Robinton | 340/825.01 |
| 4,700,280 A | 10/1987 | Onda et al. | 363/19 |
| 4,707,852 A | 11/1987 | Jahr et al. | 379/107 |
| 4,713,837 A | 12/1987 | Gordon | 379/93 |
| 4,724,435 A | 2/1988 | Moses et al. | 340/870.13 |
| 4,728,950 A | 3/1988 | Hendrickson et al. | 340/870.31 |
| 4,734,680 A | 3/1988 | Gehman et al. | 340/539 |
| 4,749,992 A | 6/1988 | Fitzmeyer et al. | 340/870.02 |
| 4,757,456 A | 7/1988 | Benghiat | 364/464 |
| 4,761,725 A | 8/1988 | Henze | 363/46 |
| 4,769,772 A | 9/1988 | Dwyer | 364/300 |
| 4,783,748 A | 11/1988 | Swarztrauber et al. | 364/483 |
| 4,827,514 A | 5/1989 | Ziolko et al. | 380/48 |
| 4,839,645 A | 6/1989 | Lill | 340/870.17 |
| 4,841,545 A | 6/1989 | Endo et al. | 375/1 |
| 4,860,379 A | 8/1989 | Schoeneberger et al. | 455/5 |
| 4,862,493 A | 8/1989 | Venkataraman et al. | 379/107 |
| 4,866,587 A | 9/1989 | Wadlington | 363/16 |
| 4,868,877 A | 9/1989 | Fischer | 380/25 |
| 4,884,021 A | 11/1989 | Hammond et al. | 324/142 |
| 4,912,722 A | 3/1990 | Carlin | 375/1 |
| 4,922,399 A | 5/1990 | Tsuzuki | 363/21.08 |
| 4,940,974 A | 7/1990 | Sojka | 340/825.08 |
| 4,940,976 A | 7/1990 | Gastouniotis et al. | 340/870.02 |
| 4,956,761 A | 9/1990 | Higashi | 363/19 |
| 4,958,359 A | 9/1990 | Kato | 375/1 |
| 4,964,138 A | 10/1990 | Nease et al. | 375/1 |
| 4,965,533 A | 10/1990 | Gilmore | 331/18 |
| 4,972,507 A | 11/1990 | Lusignan | 455/51 |
| 4,975,592 A | 12/1990 | Hahn et al. | 307/38 |
| 5,019,955 A | 5/1991 | Hoeksma | 363/21.07 |
| 5,022,046 A | 6/1991 | Morrow, Jr. | 375/1 |
| 5,032,833 A | 7/1991 | Laporte | 340/825.02 |
| 5,053,766 A | 10/1991 | Ruiz-del-Portal et al. | 340/870.02 |
| 5,053,774 A | 10/1991 | Schuermann et al. | 342/44 |
| 5,056,107 A | 10/1991 | Johnson et al. | 375/1 |
| 5,067,136 A | 11/1991 | Arthur et al. | 375/1 |
| 5,079,715 A | 1/1992 | Venkataraman et al. | 364/481 |
| 5,086,292 A | 2/1992 | Johnson et al. | 340/637 |
| 5,090,024 A | 2/1992 | Vander Mey et al. | 375/1 |
| 5,111,479 A | 5/1992 | Akazawa | 375/1 |
| 5,115,448 A | 5/1992 | Mori | 375/1 |
| 5,132,985 A | 7/1992 | Hashimoto et al. | 375/1 |
| 5,136,614 A | 8/1992 | Hiramatsu et al. | 375/1 |
| 5,140,511 A | 8/1992 | Lee et al. | 363/21.07 |
| 5,142,694 A | 8/1992 | Jackson et al. | 455/67.1 |
| 5,151,866 A | 9/1992 | Glaser et al. | 364/483 |
| 5,155,481 A | 10/1992 | Brennan, Jr. et al. | 340/870.02 |
| 5,160,926 A | 11/1992 | Schweitzer, III | 340/870.02 |
| 5,166,664 A | 11/1992 | Fish | 340/539 |
| 5,175,675 A | 12/1992 | Uramoto | 363/19 |
| 5,177,767 A | 1/1993 | Kato | 375/1 |
| 5,179,376 A | 1/1993 | Pomatto | 340/870.02 |
| 5,189,694 A | 2/1993 | Garland | 379/106 |
| 5,194,860 A | 3/1993 | Jones et al. | 340/370.02 |
| 5,204,877 A | 4/1993 | Endo et al. | 375/1 |
| 5,214,587 A | 5/1993 | Green | 364/464.04 |
| 5,225,994 A | 7/1993 | Arinobu et al. | 364/492 |
| 5,228,029 A | 7/1993 | Kotzin | 370/95.1 |
| 5,229,996 A | 7/1993 | Bäckström et al. | 370/100.1 |
| 5,239,575 A | 8/1993 | White et al. | 379/107 |
| 5,239,584 A | 8/1993 | Hershey et al. | 380/28 |
| 5,243,338 A | 9/1993 | Brennan, Jr. et al. | 340/870.02 |
| 5,252,967 A | 10/1993 | Brennan et al. | 340/870.02 |
| 5,260,943 A | 11/1993 | Comroe et al. | 370/95.1 |
| 5,270,704 A | 12/1993 | Sosa Quintana et al. | 340/870.02 |
| 5,280,498 A | 1/1994 | Tymes et al. | 375/1 |
| 5,280,499 A | 1/1994 | Suzuki | 375/1 |
| 5,285,469 A | 2/1994 | Vanderpool | 375/1 |
| 5,287,287 A | 2/1994 | Chamberlain et al. | 364/483 |
| 5,289,497 A | 2/1994 | Jacobson et al. | 375/1 |
| 5,302,905 A * | 4/1994 | Crick | 324/613 |
| 5,307,349 A | 4/1994 | Shloss et al. | 370/85.2 |
| 5,315,531 A | 5/1994 | Oravetz et al. | 364/550 |
| 5,319,300 A * | 6/1994 | Wood | 323/207 |
| 5,319,679 A | 6/1994 | Bagby | 375/106 |
| 5,329,547 A | 7/1994 | Ling | 375/1 |
| 5,345,225 A | 9/1994 | Davis | 340/635 |
| 5,359,625 A | 10/1994 | Vander Mey et al. | 375/1 |
| 5,381,462 A | 1/1995 | Larson et al. | 379/107 |
| 5,383,134 A | 1/1995 | Wrzesinski | 364/514 |
| 5,384,712 A | 1/1995 | Oravetz et al. | 364/550 |
| 5,387,873 A | 2/1995 | Muller et al. | 327/155 |
| 5,390,360 A | 2/1995 | Scop et al. | 455/34.2 |
| 5,406,495 A | 4/1995 | Hill | 364/483 |
| 5,416,917 A | 5/1995 | Adair et al. | 395/500 |
| 5,420,799 A | 5/1995 | Peterson et al. | 364/483 |
| 5,432,507 A | 7/1995 | Mussino et al. | 340/870.03 |
| 5,432,815 A | 7/1995 | Kang et al. | 375/200 |
| 5,438,329 A | 8/1995 | Gastouniotis et al. | 340/870.02 |
| 5,448,570 A | 9/1995 | Toda et al. | 370/95.3 |
| 5,450,088 A | 9/1995 | Meier et al. | 342/51 |
| 5,452,465 A | 9/1995 | Geller et al. | 395/800 |
| 5,455,533 A | 10/1995 | Köllner | 327/484 |
| 5,455,544 A | 10/1995 | Kechkaylo | 332/103 |
| 5,455,822 A | 10/1995 | Dixon et al. | 370/18 |
| 5,457,621 A * | 10/1995 | Munday et al. | 363/21.16 |
| 5,457,713 A | 10/1995 | Sanderford, Jr. et al. | 375/206 |
| 5,461,558 A | 10/1995 | Patsiokas et al. | 364/145 |
| 5,463,657 A | 10/1995 | Rice | 375/200 |
| 5,473,322 A | 12/1995 | Carney | 340/870.02 |
| 5,475,742 A | 12/1995 | Gilbert | 379/106 |
| 5,475,867 A | 12/1995 | Blum | 455/53.1 |
| 5,479,442 A | 12/1995 | Yamamoto | 375/206 |
| 5,481,259 A | 1/1996 | Bane | 340/870.03 |
| 5,491,473 A | 2/1996 | Gilbert | 340/870.01 |
| 5,493,287 A | 2/1996 | Bane | 340/825.52 |
| 5,495,239 A | 2/1996 | Ouellette | 340/870.02 |
| 5,497,424 A | 3/1996 | Vanderpool | 380/34 |
| 5,499,243 A | 3/1996 | Hall | 370/85.8 |
| 5,500,871 A | 3/1996 | Kato et al. | 375/208 |
| 5,511,188 A | 4/1996 | Pascucci et al. | 395/600 |
| 5,519,388 A | 5/1996 | Adair, Jr. | 340/870.02 |
| 5,522,044 A | 5/1996 | Pascucci et al. | 395/200.06 |
| 5,526,389 A | 6/1996 | Buell et al. | 375/200 |
| 5,528,507 A | 6/1996 | McNamara et al. | 364/483 |

| | | | |
|---|---|---|---|
| 5,528,597 A | 6/1996 | Gerszberg et al. ......... 370/95.3 |
| 5,539,775 A | 7/1996 | Tuttle et al. ................ 375/200 |
| 5,541,589 A | 7/1996 | Delaney ............... 340/870.02 |
| 5,544,036 A | 8/1996 | Brown, Jr. et al. ......... 364/145 |
| 5,546,424 A | 8/1996 | Miyake ...................... 375/206 |
| 5,548,527 A | 8/1996 | Hemminger et al. ........ 364/492 |
| 5,548,633 A | 8/1996 | Kujawa et al. ............... 379/93 |
| 5,553,094 A | 9/1996 | Johnson et al. ............. 375/200 |
| 5,555,508 A | 9/1996 | Munday et al. ............. 364/492 |
| 5,559,870 A | 9/1996 | Patton et al. ............... 379/107 |
| 5,566,332 A | 10/1996 | Adair et al. ................ 395/600 |
| 5,572,438 A | 11/1996 | Ehlers et al. ............... 364/492 |
| 5,590,179 A | 12/1996 | Shincovich et al. ........ 379/107 |
| 5,592,470 A | 1/1997 | Rudrapatna et al. ........ 370/320 |
| 5,594,740 A | 1/1997 | LaDue ......................... 379/59 |
| 5,602,744 A | 2/1997 | Meek et al. ........... 364/464.22 |
| 5,619,685 A | 4/1997 | Schiavone .................. 395/500 |
| 5,621,629 A * | 4/1997 | Hemminger et al. ....... 363/56.1 |
| 5,627,759 A | 5/1997 | Bearden et al. ............. 364/483 |
| 5,631,636 A | 5/1997 | Bane ..................... 340/825.69 |
| 5,640,679 A | 6/1997 | Lundqvist et al. ......... 455/33.2 |
| 5,659,300 A | 8/1997 | Dresselhuys et al. .. 340/870.02 |
| 5,684,472 A | 11/1997 | Bane ..................... 340/870.02 |
| 5,684,799 A | 11/1997 | Bigham et al. ............. 370/397 |
| 5,691,715 A | 11/1997 | Ouellette ............... 340/870.09 |
| 5,692,180 A | 11/1997 | Lee ............................ 395/610 |
| 5,696,501 A | 12/1997 | Ouellette et al. ...... 340/870.02 |
| 5,696,765 A | 12/1997 | Safadi ........................ 370/436 |
| 5,699,276 A | 12/1997 | Roos ....................... 364/514 A |
| 5,715,390 A | 2/1998 | Hoffman et al. ........ 395/188.01 |
| 5,717,604 A | 2/1998 | Wiggins .................. 364/514 C |
| 5,745,901 A | 4/1998 | Entner et al. ............... 707/103 |
| 5,748,104 A | 5/1998 | Argyroudis et al. ... 340/870.11 |
| 5,751,914 A | 5/1998 | Coley et al. .................. 395/51 |
| 5,751,961 A | 5/1998 | Smyk .................... 395/200.47 |
| 5,754,772 A | 5/1998 | Leaf ...................... 395/200.33 |
| 5,754,830 A | 5/1998 | Butts et al. ................. 395/500 |
| 5,778,368 A | 7/1998 | Hogan et al. ............... 707/10 |
| 5,787,437 A | 7/1998 | Potterveld et al. .......... 707/103 |
| 5,790,789 A | 8/1998 | Suarez .................. 395/200.32 |
| 5,790,809 A | 8/1998 | Holmes ................. 395/200.58 |
| 5,805,712 A | 9/1998 | Davis .......................... 380/50 |
| 5,808,558 A | 9/1998 | Meek et al. ........... 340/870.01 |
| 5,822,521 A | 10/1998 | Gartner et al. ........... 395/200.6 |
| 5,862,391 A | 1/1999 | Salas et al. ............ 395/750.01 |
| 5,872,774 A | 2/1999 | Wheatley, III et al. ..... 370/335 |
| 5,874,903 A | 2/1999 | Shuey et al. ........... 340/870.02 |
| 5,875,183 A | 2/1999 | Nitadori ..................... 370/328 |
| 5,875,402 A | 2/1999 | Yamawaki .................. 455/502 |
| 5,897,607 A | 4/1999 | Jenney et al. ................. 702/62 |
| 5,898,387 A | 4/1999 | Davis et al. ............ 340/870.02 |
| 5,910,799 A | 6/1999 | Carpenter et al. .......... 345/333 |
| 5,943,375 A | 8/1999 | Veintimilla .................. 375/355 |
| 5,963,146 A | 10/1999 | Johnson et al. ........ 340/870.01 |
| 6,000,034 A | 12/1999 | Lightbody et al. .......... 713/202 |
| 6,041,056 A | 3/2000 | Bigham et al. ............. 370/395 |
| 6,067,029 A | 5/2000 | Durston ................ 340/870.03 |
| 6,073,174 A | 6/2000 | Montgomerie et al. ..... 709/224 |
| 6,078,251 A | 6/2000 | Landt et al. ............. 340/10.41 |
| 6,078,909 A | 6/2000 | Knutson ....................... 705/59 |
| 6,088,659 A | 7/2000 | Kelley et al. ................. 702/62 |
| 6,100,817 A | 8/2000 | Mason, Jr. et al. ..... 340/870.02 |
| 6,112,192 A | 8/2000 | Capek ......................... 705/59 |
| 6,150,955 A | 11/2000 | Tracy et al. ........... 340/870.02 |
| 6,160,993 A | 12/2000 | Wilson ...................... 455/12.1 |
| 6,172,616 B1 | 1/2001 | Johnson et al. ........ 340/870.12 |
| 6,199,068 B1 | 3/2001 | Carpenter .................. 707/100 |
| 6,246,677 B1 | 6/2001 | Nap et al. ................... 370/346 |
| 6,633,825 B2 * | 10/2003 | Burns et al. ................. 702/61 |

FOREIGN PATENT DOCUMENTS

| | | |
|---|---|---|
| EP | 0 092 303 B1 | 10/1986 |
| EP | 0 288 413 A1 | 10/1988 |
| EP | 0 395 495 A1 | 10/1990 |
| EP | 0 446 979 A1 | 9/1991 |
| EP | 0 462 045 A1 | 12/1991 |
| EP | 0 629 098 A2 | 12/1994 |
| GB | 2 095 879 | 10/1982 |
| GB | 2 118 340 A | 10/1983 |
| GB | 2 157 448 A | 10/1985 |
| GB | 2 177 805 A | 1/1987 |
| GB | 2 186 404 A | 8/1987 |
| GB | 2 222 898 A1 | 3/1990 |
| GB | 2 237 910 A | 5/1991 |
| JP | 59-229949 | 12/1984 |
| JP | 61-11680 | 1/1986 |
| JP | 61-38569 | 2/1986 |
| JP | 61-284670 | 12/1986 |
| JP | 01-239473 | 9/1989 |
| JP | 01-239475 | 9/1989 |
| JP | 02-67967 A | 3/1990 |
| JP | 4290593 A | 10/1992 |
| JP | 05-260569 | 10/1993 |
| JP | 8194023 A | 7/1996 |
| WO | 86/05887 | 10/1986 |
| WO | 93/02515 A1 | 2/1993 |
| WO | 93/04451 A1 | 3/1993 |
| WO | 95/32595 A1 | 11/1995 |
| WO | 96/10856 A1 | 4/1996 |

OTHER PUBLICATIONS

"High Voltage ORing MOSFET Controller" ISL6144 by intersil Feb. 2004.*

Desbonnet, J. et al., "System Architecture and Implementation of a CEBus/Internet Gateway," *IEEE Transactions on Consumer Electronics*, 1997, 43(4), pp. 105-1062.

International Search Report issued in International Application No. PCT/US98/11170 Date of Mailing: Oct. 7, 1998.

International Search Report issued in International Application No. PCT/US98/19034 Date of Mailing: Feb. 1, 1999.

Internet Printout, http://www.ram.com BellSouth Wireless Data—Paging, Mobitex, Network, Business, Sep. 23, 1998:—MOBITEX®: The Heart of Every BellSouth Solution—Mobitex Features and Services: RAM Mobile Data White Paper, Feb. 1997—Narrowband PCS Technologies: What are the Options?: RAM Mobile Data White Paper, Nov. 1997—The Inherent Security of Data Over Mobitex Wireless Packet Data Networks, A RAM Mobile Data White Paper, Oct. 1995—Comparative Analysis of Coverage and Performance: RAM & Ardis, 1998.

Internet Printout, http://www.ardis.com "Ardis Two-Way, Wireless Data Communications," ARDIS, Sep. 23, 1998.

Internet Printout, http://www.ardis.com/RADIO "An Overview of Radio Coverage," Sep. 29, 1998 "Radio Propagation," Sep. 29, 1998 "Factors Affecting ARDIS Coverage," Sep. 29, 1998 "The ARDIS Network Compared to Other Systems," Sep. 29, 1998.

Internet Printout, http://www.ardis.com/RADIO "Radio Coverage," Sep. 29, 1998 "Glossary of Terms," Sep. 29, 1998 "Radio Propagation in Free Space," Sep. 29, 1998 "Real World Propagation Variations," Sep. 29, 1998 "Probability of Reception vs. Calculation," Sep. 29, 1998.

Markwalter, B. E. et al., "CEBus Network Layer Description," *IEEE Transactions on Consumer Electronics*, Aug. 1989, 35(3), 571-576.

"MV-90 Read Only System" UTS Software Solutions For Utility Customers. No Date). (No Page Numbers or Pages).

Newton, H., *Newton's Telecom Dictionary*, CMP Books, 17th Ed., 2001, Pages: LAN (p. 394); CEBUS (p. 134).

Rappaport, T. S., "Wireless Communications, Principles and Practice," Prentice Hall PTR, 1996, pp. 410-413.

"Enter the Electronic Metering Age with GE, The Electronic Polyphase Demand Meter, Ge electronic Metering", *GE Meters Brochure*, Somersworth, NH, Sep. 1989.

Kingston, G.A. et al., "Multi Function Polyphase Metering- An Integrated Approach", *Schlumberger Industries Electricity Management, UK*.

Garverick, S. L. et al., "A Programmable Mixed-Signal ASIC of Power Metering", *IEEE Journal of Solid State Circuits*, 1991, 26(12), 2008-2016.

Gaverick, S.L. et al., "A Programmable Mixed-Signal ASIC for Power Metering", *IEEE International Solid State Circuits Conference*, 1991, 36-37.

Kohler, H., Elektronischer Hochprazisionzahler im 19-Zoll-Einbaughehause fur Wirkverbrauch-und Blindverbrauchzuhlung, *Siemens Magazine*, 1977, 345-349.

Eggenberger, H.P., "An Electronic Electricity Meter for Active and Reactive Energy Consumption", *Nue Zurcher Zeitung*, Sep. 6, 1989.

In the Matter of Australian Patent Application 688711 in the name of ABB Power T&D Company, Inc., and In the Matter of Opposition Thereto by Electrowatt Technology Innovation Corporation, *Revised Statement of Grounds and Particulars in Support of Opposition*, Feb. 19, 1999.

In the Matter of Australian Patent Application No. 688711 in the name of ABB Power T & D Co. Inc and in the matter of Opposition thereto by Electrowatt Technology Innovation Corp., Statement of Grounds and Particulars in Support of Opposition, Aug. 12, 1998.

Landis & Gyr, "Electronic Meter, Class 0, 2:ZFRI, ZNRI," Jul. 1971.

Landis & Gyr Instruction/Technical Manual, Solid State Meter Class 20, Form 9s, Bulletin 920, Lafayette, IN, Aug. 4, 1987.

Landis & Gyr, Bulletin 930 SSM2 Instruction/Technical Manual Polyphase Solid State Meter, Landis & Gyr, Lafayette, Indiana, date available.

Landis & Gyr, ZMA110m402-Solid State Precision Meter IEC Class 1.0.

Landis & Gyr, "Z.T. Precision Solid-State Meters", Oct. 1988.

Laumann, H. et al., "Class 0,5 Precision Meter With Solid-State Measuring Elements", Landis & Gyr Review, Sep. 1974.

Lester, G., "A Communications Protocol for Reading and Programming Electronic Metering Devices from Hand Held Units", GEC Meters, UK.

Schwendtner, M. et al., "Elektronischer Haushaltszahler" Elektrontechnische Zeitschrift etz, vol. 112, 6(7), 1991, 320-323.

McGrath, D.T., "Signal Processing Considerations in Power Management Applications", *GE Corporate Research and Development*, 1991.

MT100 electronic Time-of-Use Register Instruction Manual 0505, Schlumberger Industries, Dec. 1991.

Negahaban, M., "A DSP Based Watthour Meter", Silicon Systems, Inc., Nov. 23, 1988.

Negahban, M. et al., "A DSP-Based Watthour Meter", *IEEE International Solid State ircuits Conference Digest of Technical Papers 36th ISSC 1st Ed.*, NY, NY, USA, 15-17, Feb. 1989.

Nilsen, "EMS 2100 Electricity Consumption Analyzer-Australian Design Award", 1998, 1-16.

Hutt, P.R. et al. "Design, Benefits and Flexibility in Intelligent Metering Technology", *Polymeters Limited, UK*.

Product Brochure: "KVI Polyphase Combination Meter", Jul. 1988.

Progress in the Art of Metering Electric Energy, *The Institute of Electrical & Electronics Engineers, Inc*, Electricity Metering Subcomittee, 1969.

QUAD4® Plus Multifunction Electronic Meter, User's Guide, Document A-117350, Revision L., Process Systems, Charlotte, NC, 1993.

Quantum Multi-Function Polyphase Meter Type SQ400, Preliminary Instruction Manual Draft III, Mar. 1983.

Quantum Technical Guide, Jul. 1898.

ST-MT 100 Electronic Time-of-Use Instruction Manual 0505, Sangamo Westing, Inc., May 1987.

Quantum. RTM. Electronics Meter Filed Reference Manual for Q101, Q111, Q121, Q200, Q210, Q220 and Q230 Electronic Meters, Schlumberger Industries, prior to Jan. 1991.

ST-DS130 Recorder Module Product Bulletin 13157, Schlumberger Industries, Sep. 1988.

ST-Q101 Series Electronic Meter, Product Bulletin 10253, Schlumberger Industries, Sep. 1988.

ST-Q200 Series System Measurement, Product Bulletin 10255, Schlumberger Industries, 1988.

ST-Q200 Series System Measurement, Product Bulletin 10255, Schlumberger Industries, Nov. 1990.

Su, K. L., "Fundamentals of Circuits, Electronics and Signal Analysis", Georgia Institute of Technology, Atlanta, Ga, Dec. 1996, 1, 61-63.

Summers, R., Integrated Semiconductor Solutions for Metering and Telemetering Applications, Apr. 1990, Texas Instruments.

Three-Phase, Watt-Hour Meter IC, *Electronic Design*, Feb. 23, 1989.

Usenko, VV. Et al., "Meter for Recording the Energy of Single and Rarely-Repeating Ultrahigh-Energy Pulses", *Radiotekhnika, Kharkov*, Ukranian SSR, 1988, 86, 44-48.

In the Matter of Australian Patent Application No. 688711 in the name of ABB Power T & D Co. Inc and in the Matter of Opposition thereto by Electrowatt Technology Innovation Corp., Patents Act 1990, Decision of a Delegate of the Commisioner of Patents, Dec. 19, 2000, 14 pages.

Gow, J., *Electricial Metering Practices*, 1973, physical copy unavailable.

Handbook for Electricity Metering, 1981, Physical copy unavailable.

* cited by examiner

BIAS TECHNIQUE FOR ELECTRIC UTILITY METER

FIELD OF THE INVENTION

The invention relates generally to the field of electric utility meters. More specifically, the invention relates to techniques for facilitating efficient operation of electric utility meters.

BACKGROUND OF THE INVENTION

Electric utility companies and power consuming industries have in the past employed a variety of approaches to metering electrical energy. Typically, a metering system monitors power lines through isolation and scaling components to derive polyphase input representations of voltage and current. These basic inputs are then selectively treated to determine the particular type of electrical energy being metered. Because electrical uses can vary significantly, electric utility companies have requirements for meters configured to analyze several different nominal primary voltages, the most common of which are 96, 120, 208, 240, 277 and 480 volts root mean squared (RMS).

Electric utility meters employing electronic components instead of electromechanical components have become more widely used in the industry. The use of electronic components including microprocessor components have made electricity metering faster and more accurate. Of course, the meters typically receive and monitor alternating current (AC) power from the power distribution system. Usually, direct current (DC) power is required to operate the meter's electronic components. Therefore, electronic meters use power supply devices to generate DC power from the already-available and constantly-present AC line voltage. As discussed in U.S. Pat. No. 5,457,621, which is incorporated herein by reference, power supply devices have been created to generate the required microprocessor DC power regardless of the value of the available line voltages (e.g., 96 to 480 volts RMS).

Unlike the former electromechanical components, electronic meters use more sophisticated electronic circuitry to accurately sense and measure AC voltage and current on the power distribution system (i.e., line voltage and line current). In order to minimize cost, however, power sensing circuitry is kept as simple as possible. For example, in lieu of more complicated circuit isolation techniques (although not excluded from scope of the invention), meters often employ power line-referenced voltage sensing techniques.

One type of power line-referenced sensing technique accomplishes voltage sensing with high value resistors in a resistive-divider circuit configuration. Resistive voltage sensing typically requires that the meter's electronic circuits use a voltage that is referenced to one side of the AC power line. In addition, the measurement of electrical power by the electronic metering circuits require that line voltage and line current be sensed very accurately. For example, typical voltage sensing accuracy is usually greater than 0.1% in order to allow the overall meter accuracy to be greater than 0.2%. Line-referenced sensing techniques, like resistive division circuitry, insure compatibility with the sensitive electronic sensing circuits required to meet the meter's rigid measurement accuracy requirements.

Because the voltage being sensed is an alternating voltage signal, the sensed voltage (and therefore also the voltage reference provided to the meter's electronic circuitry) normally swings above and below a referenced ground level. In the context of an electronic circuit that receives DC power from a power supply, for example, often the less expensive electronic circuits (e.g., amplifiers) cannot receive a signal that drops below the power supply's negative power rail (e.g., for a 5 VDC power supply the positive rail may be +5 and the negative rail may be 0 VDC). Therefore, these electronic circuits often cannot use the AC power line's voltage because it swings below the ground-referenced level or negative power rail.

Attempting to use lower cost components and reduce power consumption to keep meter costs down is relevant to any meter environment, and particularly the residential meter environment. For example, although the invention is not limited to this application alone, 240 VAC residential meters often use limited current, fixed voltage capability power supplies (e.g., a linear capacitive divider power supply), which apply even greater power constraints on the power supply.

Therefore, there is a need to adjust or bias the AC voltage inputted to the meter's electronic circuitry so as to prevent it from swinging below the referenced ground level, while maintaining the meter's required level of measurement accuracy.

SUMMARY OF THE INVENTION

The invention contemplates an electrical power meter and method of operating the same, where the meter has electronic components (e.g., a power supply and a voltage sensing circuit) and receives alternating current (AC) voltage from an electrical power line. The inventive meter includes a power supply that converts the AC voltage to a direct current (DC) voltage for powering the electronic components. Also, the AC voltage provides an electrical reference potential for the electronic components. The inventive meter further includes a DC power source (e.g., a diode and/or a resistor in series connection) in a parallel circuit configuration with the AC voltage. The DC power source provides a DC bias voltage to the AC voltage. The AC voltage may create a relatively small voltage across the diode device. Also, the diode device may have a dynamic AC impedance that is approximately an order of magnitude less than a DC impedance of the diode. The DC power source may provide a DC voltage that biases the AC voltage-based reference potential to a value that permits operation of the electronic components. In another embodiment, the DC power source may be a capacitive element in parallel with a resistive element, where the capacitive element operates to reduce the dynamic AC impedance of the resistive element.

The inventive method includes receiving an AC voltage from the electric power line, converting the AC voltage to a DC voltage, and adjusting the AC voltage provided to the electronic components, as a function of the AC voltage. The AC voltage provides an electrical reference potential for the electronic components. The inventive method may further comprise increasing the reference-based AC voltage provided to a voltage sensing circuit, while creating a relatively small voltage across the DC power source as a function of the AC voltage. The adjusting may be accomplished by a DC power source, for example, a diode and/or a resistive element in series. The method may further create a DC voltage from the DC power source that biases the AC voltage-based reference potential to a value that permits operation of the electronic components.

DETAILED DESCRIPTION OF ILLUSTRATIVE EMBODIMENTS

Figure 1:
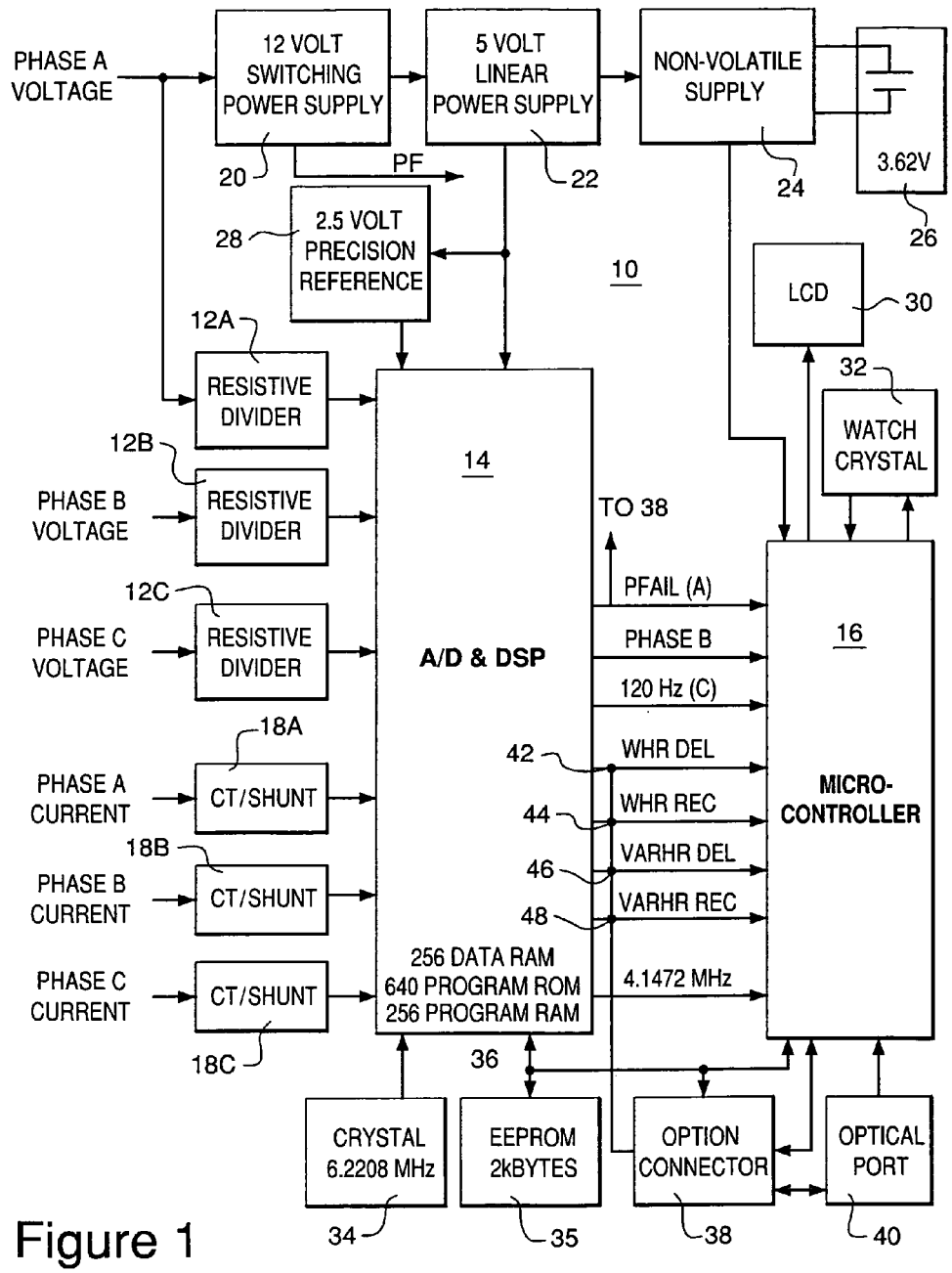
FIG. 1 is a block diagram of an electronic meter.

FIG. 1 is a block diagram of an electronic meter. As shown in FIG. 1, meter 10 is shown to include three resistive voltage divider networks 12A, 12B, 12C; a first processor— an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12 V switching power supply 20 that is capable of receiving inputs in the range of 96-528 V; a 5 V linear power supply 22; a nonvolatile power supply 24 that switches to a battery 26 when 5 V supply 22 is inoperative; a 2.5 V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A-12C and current signals are induced in a current transformer (CT) and shunted. The output of CT/shunt combinations 18A-18C is used to determine electrical energy.

First processor 14 is connected to receive the voltage and current signals provided by dividers 12A-12C and shunts 18A-18C. As will be explained in greater detail below, processor 14 converts the voltage and current signals to voltage and current digital signals, determines electrical energy from the voltage and current digital signals and generates an energy signal representative of the electrical energy determination. Processor 14 will always generate a watthour delivered (Whr Del) and, watthour received (Whr Rec), depending on the type of energy being metered, will generate either a volt amp reactive hour delivered (Varhr Del)/a volt amp reactive hour received (Varhr Rec) signal or volt amp hour delivered (Vahr Del)/volt amp hour received (Vahr Rec) signal. In the preferred embodiment, each transition on conductors 42-48 (each logic transition) is representative of the measurement of a unit of energy. Second processor 16 is connected to first processor 14. As will be explained in greater detail below, processor 16 receives the energy signal(s) and generates an indication signal representative of said energy signal.

It will be noted again that meter 10 is a wide range meter capable of metering over a voltage range from 96-528 V. The components which enhance such a wide range meter include the divider network 12A-12C, which as previously noted are connected to receive the voltage component. The dividers generate a divided voltage, wherein the divided voltage is substantially linear voltage with minimal phase shift over the wide dynamic range, i.e. 96-528 Volts. A processing unit (processors 14 and 16) is connected to receive the divided voltage and the current component. The processing unit processes the divided voltages and the current components to determine electrical energy metering values. It will be appreciated from the following description that processors 14 and 16 require stable supply voltages to be operable. A power supply, connected to receive the voltage component and connected to processors 14 and 16, generate the necessary supply voltages from the Phase A voltage component over the wide dynamic range. Power supply 20 could also run off of phase B and phase C voltages or a combination of the above. However, a combination embodiment would require additional protection and rectifying components.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Processor 14 is essentially a programmable digital signal processor (DSP) with built in multiple analog to digital (A/D) converters. The converters are capable of sampling multiple input channels simultaneously at 2400 Hz each with a resolution of 21 bits and then the integral DSP performs various calculations on the results. For a more detailed description of Processor 14, reference is made to a co-pending application Ser. No. 839,182 filed on Feb. 21, 1992, and abandoned in favor of application Ser. No. 259,578, which is incorporated herein by reference and which is owned by the same assignee as the present application.

Meter 10 can be operated as either a demand meter or as a time-of-use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A-12C for all three phases, the shunt resistor portion of 18A-18C, oscillator 34, processor 14, processor 16, reset circuitry, EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35. The additional time-of-use billing data is stored in the internal RAM of processor 16, which RAM is backed by battery 26.

Consider now the various components of meter 10 in greater detail. Primary current being metered may be sensed using conventional current transformers. The shunt resistor portion of devices 18A-18C is located on the electronics assembly.

The phase voltages are brought directly to the electronic assembly where resistive dividers 12A-12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Consider now the particulars of the power supplies shown in FIG. 1. As indicated previously, the off-line switching supply 20 is designed to operate over a 96-528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequencies can be used.

Figure 2:
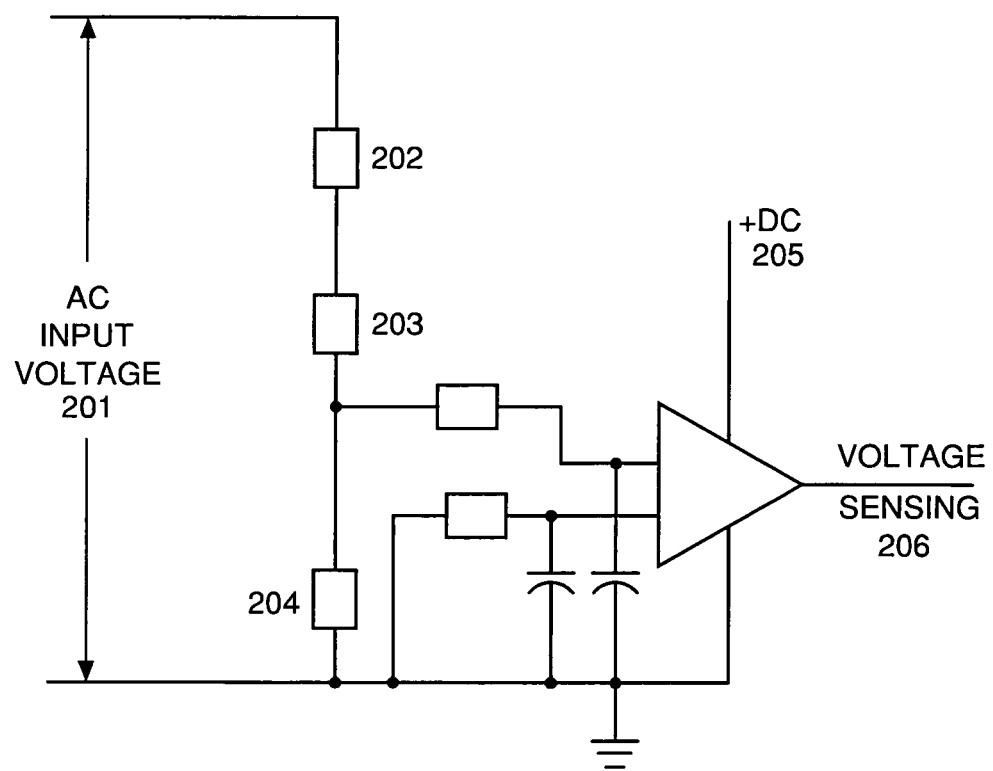
FIG. 2 is a schematic diagram of a voltage sensing portion of an electric meter circuit.

FIG. 2 is a schematic diagram of the voltage sensing portion of the electric meter circuit. As shown in FIG. 2, an AC input voltage 201 (e.g., 240 volts) is in a parallel circuit configuration with resistors 202 and 203. Resistors 202 and 203 may be approximately 1 megaohm each. Also, a resistor 204 is in series with resistors 202 and 203. A power supply 205 provides DC power to a voltage sensing portion 206 of the electric meter, as well as to other electronic components in the meter.

Resistors 202-204 operate to scale the inputted AC line voltage down to a level capable of being processed by the meter's electronic components. As shown in FIG. 2, the electronic components, including power supply 205 are referenced to the AC line voltage. Resistive division is used to divide the input voltage so that a linear voltage with minimal phase shift over a wide dynamic range can be obtained. This, in combination with a switching power supply, allows a wide voltage operating range to be implemented.

Resistors 202 and 203 drop the AC line voltage at an acceptable power loss. Resistors 202 and 203 feed resistor 204. Resistors 204 may be metal film resistors with a minimal temperature coefficient, and may be in the range of about 100 ohms to about 1 Kohms to assure a sensed voltage signal that keeps the amplifier of the sensing circuit within a linear operating range. Resistors 202 and 203 may have an operating voltage rating of 300 Vrms each. Resistor 204 scales the AC input voltage to be less than 1 Volt peak-to-peak, for example, or to a level that may be used by the meter's electronic components, like voltage sensing circuit 206.

Figure 3:
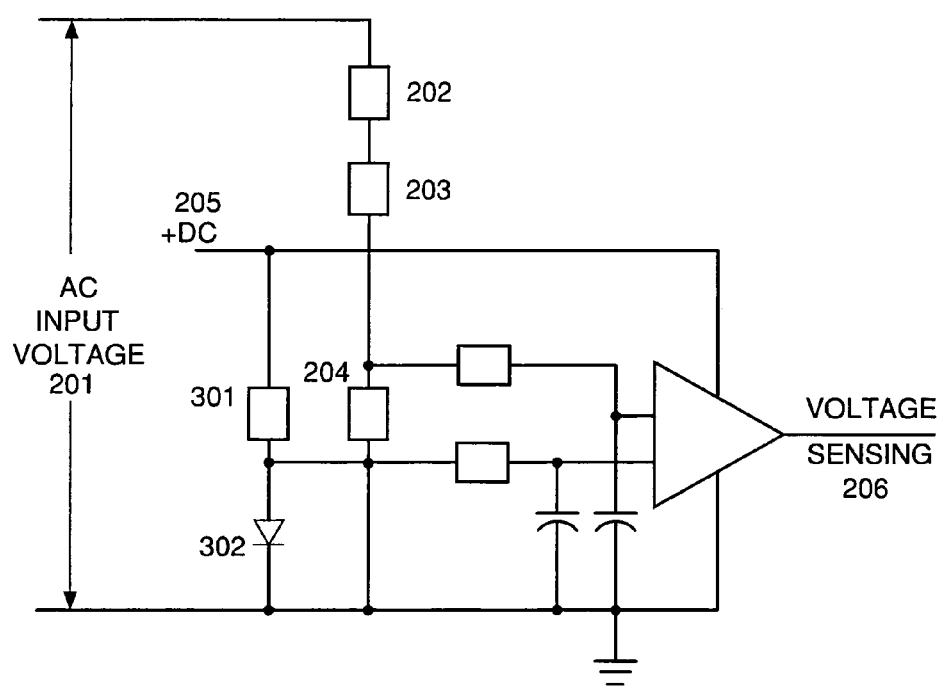
FIG. 3 is a schematic diagram of one embodiment of a voltage sensing portion of an electric meter circuit, according to the invention.

FIG. 3 is a schematic diagram of one embodiment of a voltage sensing portion of the electric meter circuit, according to the invention. As shown in FIG. 3, a low cost silicon diode 302 and a resistive element 301 are in parallel circuit configuration with AC input voltage 201. Diode 302 and resistive element 301 also are in parallel circuit configuration with power supply 205.

Figure 4:
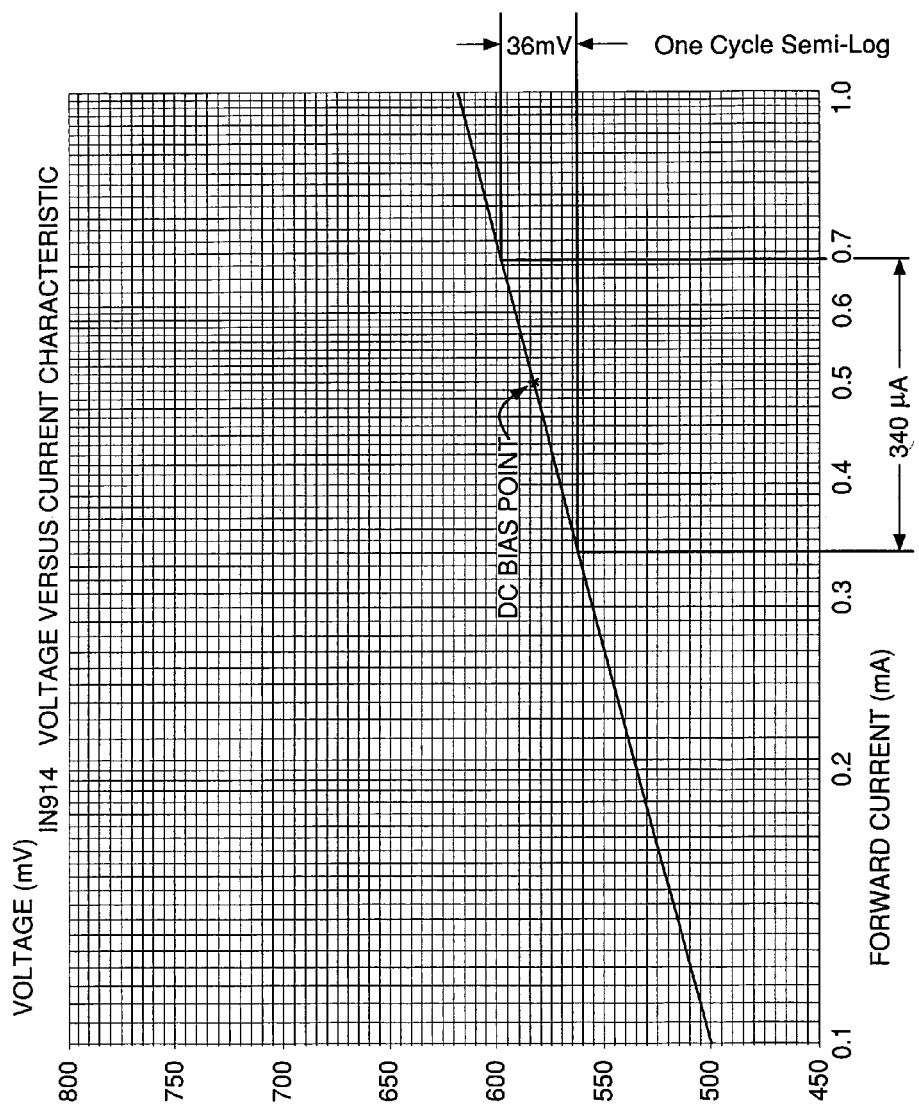
FIG. 4 is a graphical representation of voltage and current for a typical industry diode, according to the invention.

In operation, diode 302 and resistive element 301 act to develop a DC voltage that biases the AC voltage 201 inputted to the meter. In one embodiment, diode 302 may be provided with a minimum level of forward biasing current so as to offer the least amount of loading on power supply 205, and thus keeping overall cost of the meter low. For example, with a forward biasing current of approximately 0.5 ma, diode 302 may have a voltage of approximately 0.584 volts. FIG. 4 is a graphical representation of voltage versus current for a typical industry diode type "IN914." Because, both inputs of the amplifier that are sensing the voltage signal have their potential referenced to the voltage of diode 302, the desired DC bias is achieved.

Also, the AC current that is created by the voltage sensing resistors 202-204 flows through diode 302 and resistive element 301. In order to not adversely effect the measured AC line voltage 201 with the voltage created by diode 302 and resistive element 301 as result of AC line voltage 201, diode 302 is selected to have a minimum AC dynamic impedance as compared its static DC impedance. For example, diode 302 may be selected with an AC dynamic impedance having a value with an order of magnitude less than its static (DC) impedance. Referring again to the graph of a type IN914 diode in FIG. 4, even where a nominal AC current flowing through the sensing resistors 202-204 is 340 microamperes peak-to-peak, the voltage developed across diode 302 is only approximately 36 millivolts. An AC line voltage created across diode 302 of just 36 millivolts compared to the available line voltage (e.g., 240 volts), will not create a measureable error in the voltage sensing of the meter.

Figure 5:
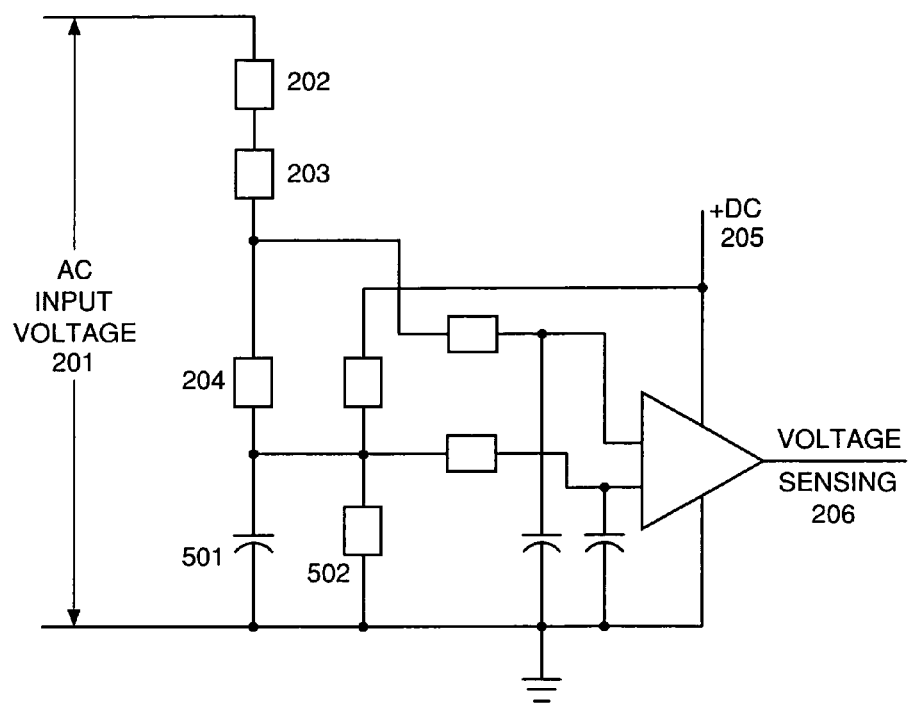
FIG. 5 is a schematic diagram of another embodiment of a voltage sensing portion of the electric meter circuit, according to the invention.

The invention is not limited to the use of a diode and resistor to create a biasing DC voltage, but may include the use of any type of DC power source. For example, the meter may use a battery or a solar cell to create the DC bias. In addition, the meter may use other electronic circuit components to create the DC bias, like a resistor. FIG. 5 illustrates the use of a resistive element 502 to create a DC bias voltage to the AC input voltage.

As shown in FIG. 5, AC input voltage 201 is in parallel configuration with sensing resistors 201-204. In addition, AC input voltage 201 is in parallel configuration with a capacitor 501 and a resistive element 502. Using bias voltage values similar to that discussed above with respect to FIG. 3, if a DC bias of 0.584 volts is desired across resistive element 502 using 0.5 milliamps of current, the impedance required for resistive element is 1168 ohms. Unlike the diode element discussed with reference to FIG. 3, however, a resistive element has a substantially similar dynamic AC impedance and static DC impedance. As a result, with resistive element 502 having an impedance of 1168 ohms, and with a sensing current of 340 microamps peak-to-peak, a voltage of approximately 0.4 volts is created across resistive element 502.

Unlike the 36 milliamps created by the diode bias configuration discussed above with reference to FIG. 3, the 0.4 volts generated by the resistive element configuration may have an undesirable impact on the meter's voltage sensing capabilities and accuracy. Therefore, as shown in FIG. 5, a capacitive device 501 may be located in a parallel circuit configuration with resistive element 502. In this way, capacitive device 501 may act to offset the dynamic AC impedance of resistive element 502, while substantially maintaining the static DC impedance of resistive element 502. For example, a capacitive element 501 having a value of approximately 25 microfarads may be selected so as to have a substantially similar level of dynamic AC impedance as the diode-biasing configuration discussed above with reference to FIG. 3.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. For example, although described in the single phase metering context, the invention applies equally to the polyphase meter context. In the polyphase metering context, each of the voltage sensing circuits for the relevant phases would have similar resistive divider circuits and that would terminate at the described DC biasing power source (e.g., diode and/or resistor/capacitor).

Accordingly, it should be appreciated that those skilled in the art, having the benefit of the teachings of this specification, may affect numerous modifications thereto and changes may be made without departing from the scope and spirit of the invention.

What is claimed:

1. An electrical power meter having electronic components, wherein the electrical power meter receives alternating current (AC) voltage from an electrical power line, the meter comprising:
   a power supply for converting the AC voltage to a direct current (DC) voltage for powering the electronic components, wherein the AC voltage provides an electrical reference potential for the electronic components; and
   a DC power source in parallel circuit configuration with the AC voltage, wherein the DC power source provides a DC bias voltage to the AC voltage, and wherein the DC bias voltage maintains the AC voltage above a predetermined voltage level acceptable to the power supply.

2. The meter of claim 1, wherein the DC power source comprises a diode.

3. The meter of claim 2, wherein the diode has a forward bias current of approximately 0.5 milliamps and a forward bias voltage of approximately 0.584 volts.

4. The meter of claim 2, wherein the AC voltage creates a relatively small voltage across the diode.

5. The meter of claim 2, wherein a dynamic AC impedance of the diode is approximately an order of magnitude less than a DC impedance of the diode.

6. The meter of claim 2, wherein the diode is an IN914 diode.

7. The meter of claim 2, wherein the DC power source comprises a first resistive element in series connection with the diode.

8. The meter of claim 1, wherein the DC power source provides a DC voltage having a value that biases the AC voltage-based reference potential to a value that permits operation of the electronic components.

9. The meter of claim 1, wherein the electronic components comprise a voltage sensing circuit for sensing the AC voltage.

10. The meter of claim 1, wherein the voltage sensing circuit comprises a resistive divider circuit.

11. The meter of claim 10, wherein the resistive divider circuit comprises a first, second, and third resistive element.

12. The meter of claim 11, wherein the first and second resistive element each have a value of approximately 1 megaohm.

13. The meter of claim 1, wherein the DC power source biases the AC voltage as a function of the AC voltage.

14. The meter of claim 1, wherein the DC power source comprises a capacitive element in parallel with a first resistive element.

15. The meter of claim 14, wherein the resistive element has a value of approximately 1168 ohms.

16. The meter of claim 14, wherein the capacitive element has a value of approximately 25 microfarads.

17. The meter of claim 14, wherein the capacitive element operates to reduce the dynamic AC impedance of the resistive element.

18. The meter of claim 8, wherein the AC voltage-based reference potential is greater than negative power supply rail.

19. The meter of claim 1, wherein the DC power source comprises at least one of the following: a battery and a solar cell.

* * * * *